United States Patent
Brown

(10) Patent No.: US 6,218,887 B1
(45) Date of Patent: *Apr. 17, 2001

(54) METHOD OF AND APPARATUS FOR MULTIPLEXING MULTIPLE INPUT SIGNALS

(75) Inventor: Kevin L. Brown, Orlando, FL (US)

(73) Assignee: Lockheed Martin Corporation, Bethesda, MD (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/713,861

(22) Filed: Sep. 13, 1996

(51) Int. Cl.[7] ................................................. H03K 17/62
(52) U.S. Cl. ............................................. 327/408; 327/99
(58) Field of Search .............................. 327/407–411, 99

(56) References Cited

U.S. PATENT DOCUMENTS

| | | | |
|---|---|---|---|
| 3,654,394 | * | 4/1972 | Gordon ................................. 327/408 |
| 3,783,307 | * | 1/1974 | Breuer .................................. 327/411 |
| 3,885,220 | | 5/1975 | Fluegal ................................. 327/407 |
| 4,191,856 | * | 3/1980 | Nagano et al. ....................... 327/411 |
| 4,236,088 | * | 11/1980 | Horiuchi et al. ..................... 327/407 |
| 4,260,959 | * | 4/1981 | Allgood ................................ 331/111 |
| 4,626,707 | * | 12/1986 | Arita et al. ........................... 327/407 |
| 4,814,648 | * | 3/1989 | Hynecek .............................. 327/563 |
| 4,932,027 | * | 6/1990 | Scharrer ............................... 327/408 |
| 5,180,932 | * | 1/1993 | Bengel ................................. 327/362 |
| 5,182,467 | * | 1/1993 | Taylor et al. ......................... 327/408 |
| 5,196,733 | * | 3/1993 | Shin ..................................... 327/411 |
| 5,281,860 | | 1/1994 | Krenik et al. ......................... 327/407 |
| 5,281,867 | | 1/1994 | Campbell, Jr. et al. ................ 327/91 |
| 5,528,191 | * | 6/1996 | Yasuda ................................. 327/561 |
| 5,546,042 | * | 8/1996 | Tedrow et al. ....................... 327/561 |
| 5,737,368 | * | 4/1998 | Shou et al. ........................... 375/343 |
| 5,854,563 | * | 12/1998 | Oh et al. ................................ 327/74 |
| 5,880,604 | * | 3/1999 | Kawahara et al. ................... 327/544 |

FOREIGN PATENT DOCUMENTS 2-58924 * 2/1990 (JP) ..................................... 327/407

* cited by examiner

Primary Examiner—Kenneth B. Wells
(74) Attorney, Agent, or Firm—Burns, Doane, Swecker & Mathis, LLP

(57) ABSTRACT

A multiplexer selects multiple input signals to produce an output in which the distortion associated with switching is minimized. Selection of the multiple input signals is performed within a multiplexing operational amplifier. The operational amplifier includes differential amplifiers that receive the respective input signals at their respective non-inverting nodes. The differential amplifiers are connected to a feedback signal at their respective inverting nodes. The input signals are selected for output by turning on selection switches within the operational amplifier, causing the respective differential amplifiers to be selected. This minimizes non-linearities in the output due to capacitive coupling and eliminates unwanted resistive effects without requiring complicated circuitry. The selection switches may include complementary back-to-back MOSFETs, or alternatively, same-channel MOSFETs connected in series to cancel capacitive coupling and switch feedthrough within the multiplexing op-amp.

15 Claims, 16 Drawing Sheets

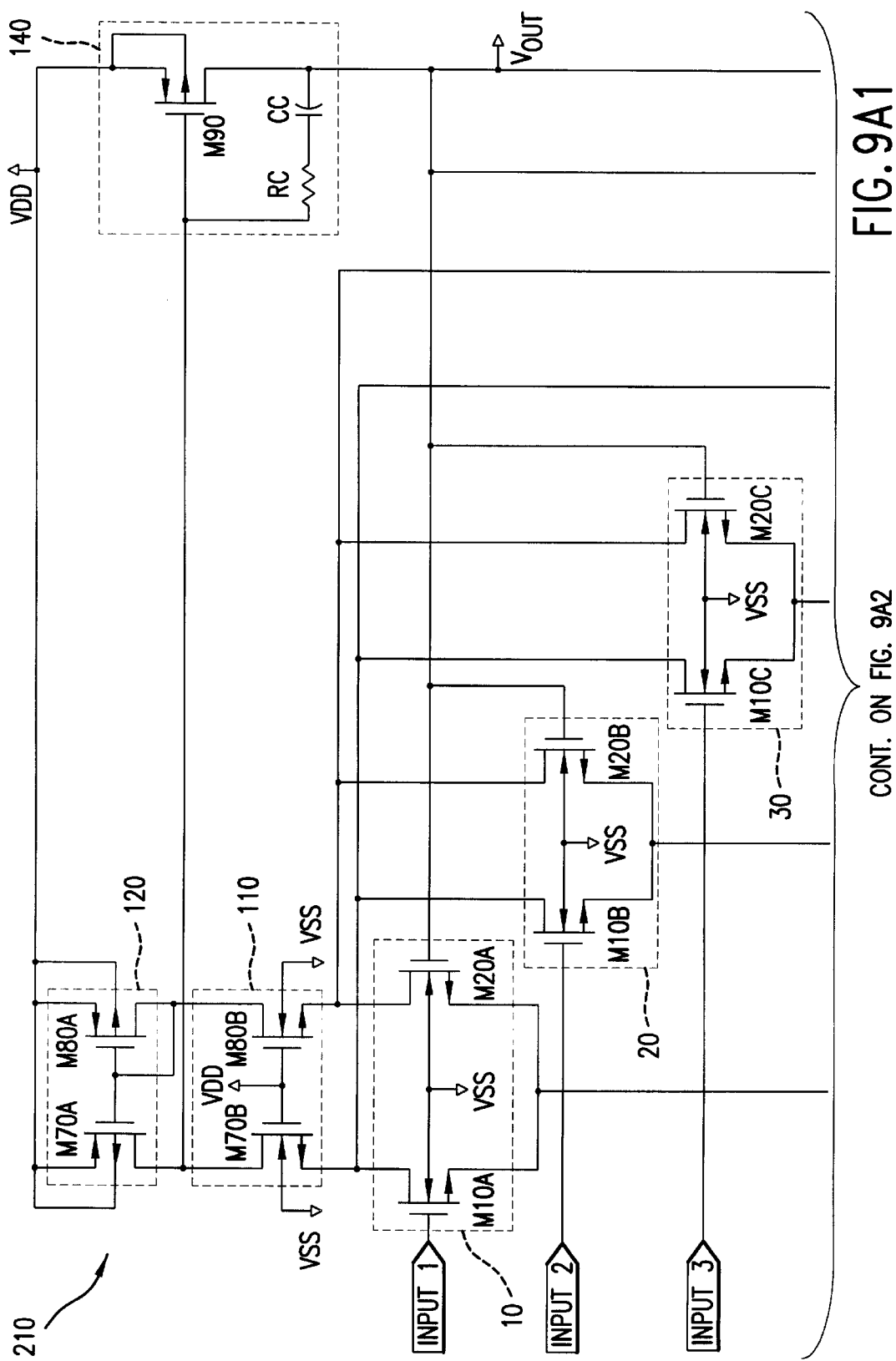
FIG. 9A1

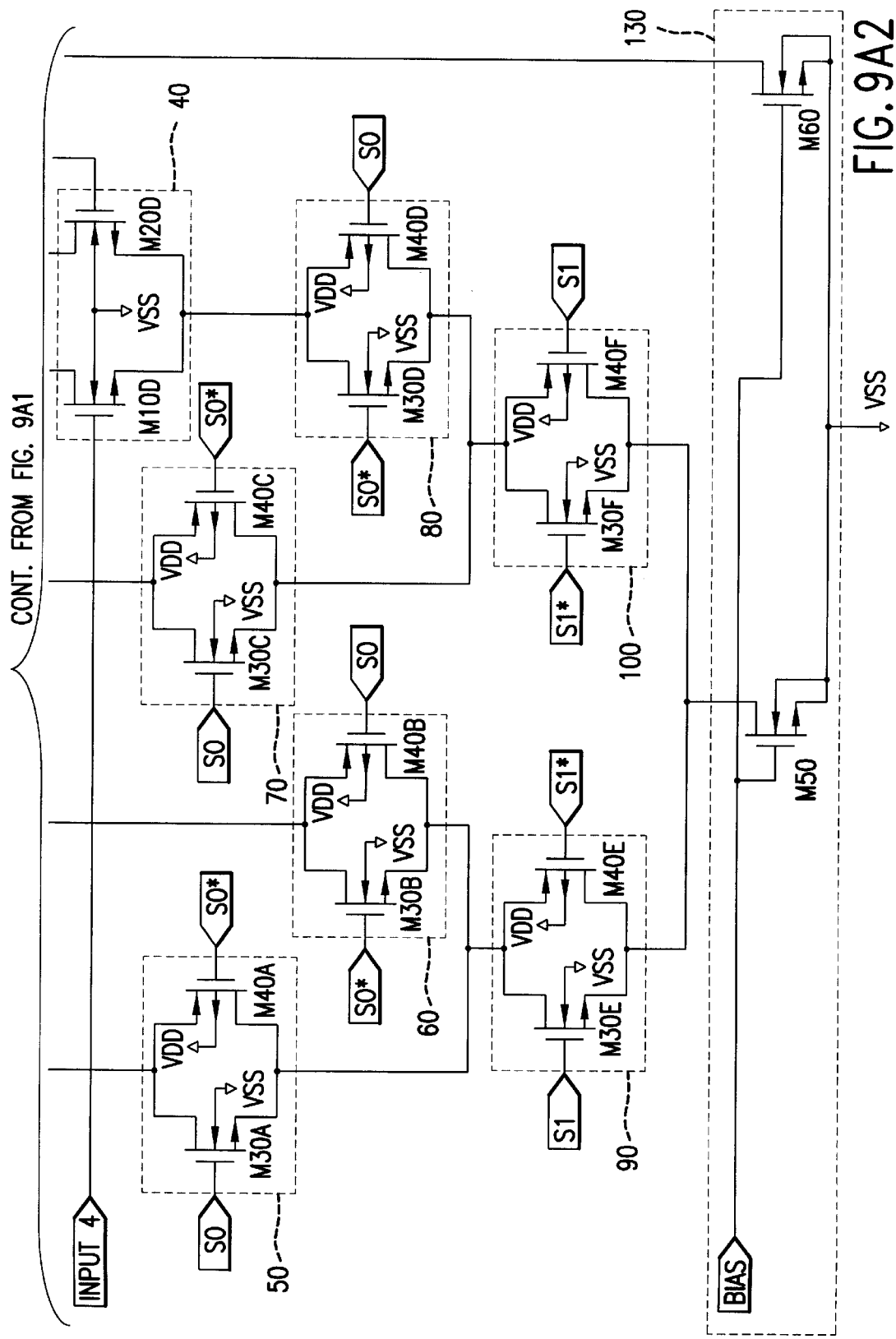

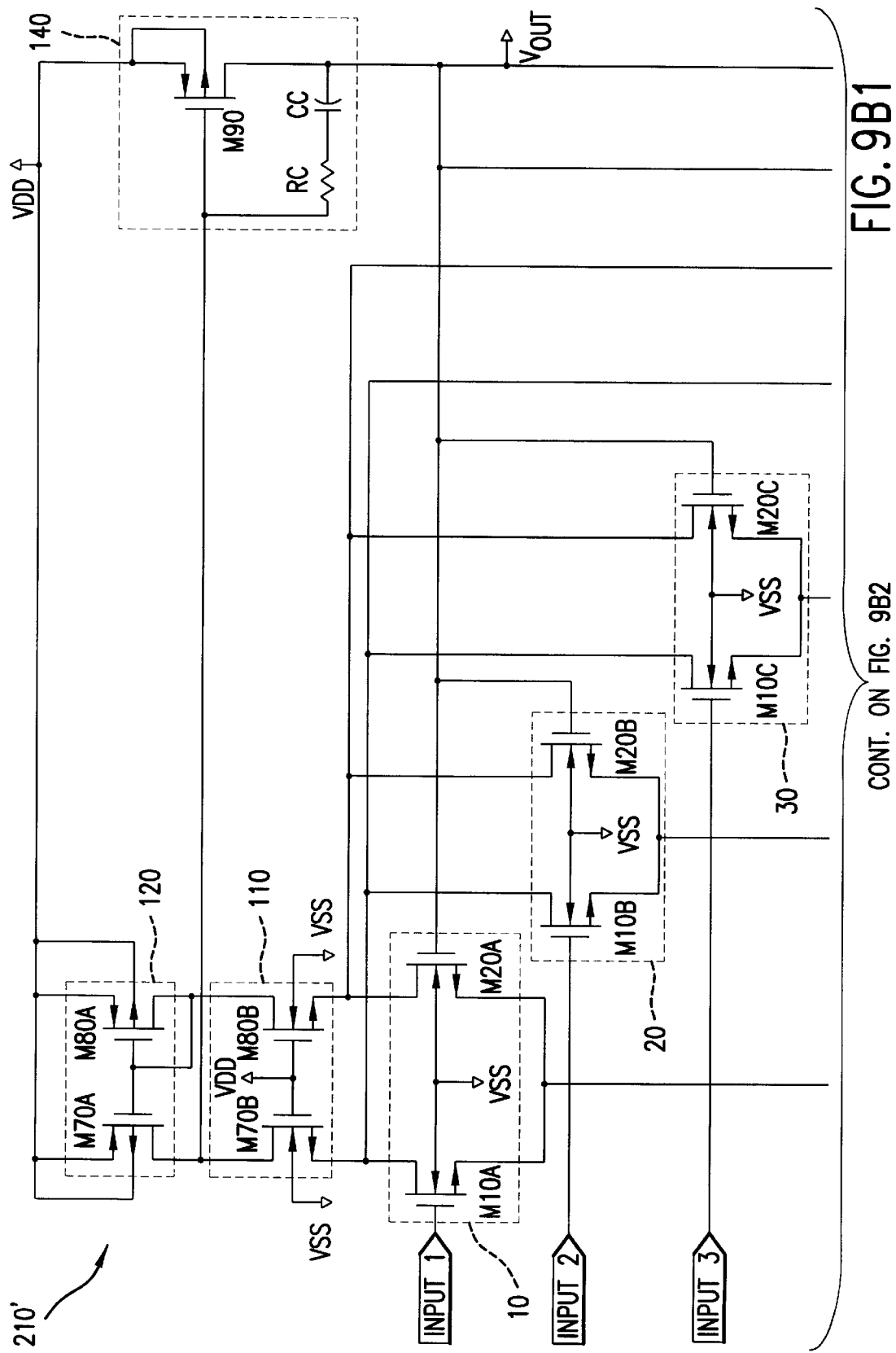
FIG. 9B1

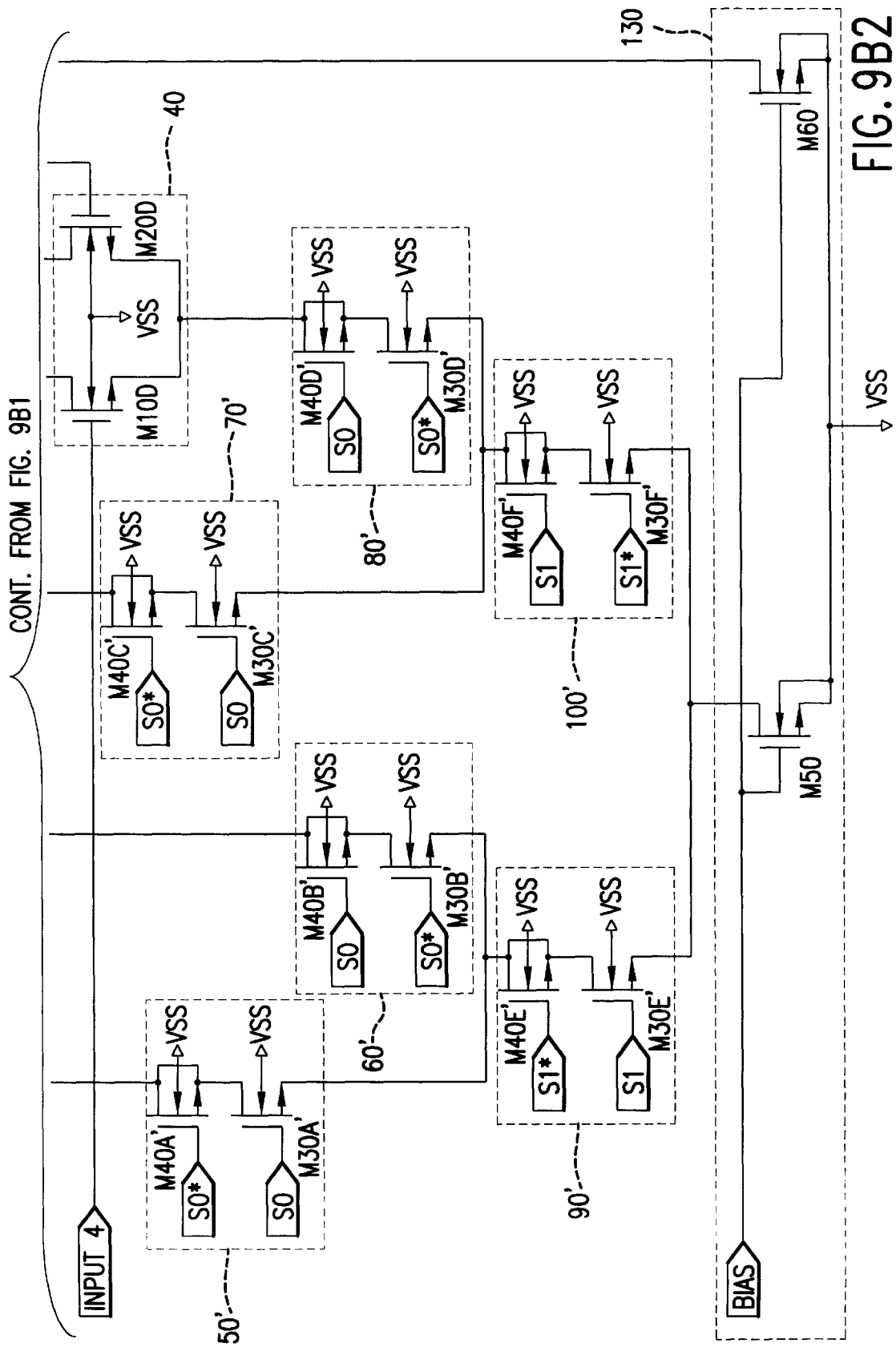

METHOD OF AND APPARATUS FOR MULTIPLEXING MULTIPLE INPUT SIGNALS

This invention relates to a method of and an apparatus for selecting among multiple input signals. More particularly, this invention relates to use of an operational amplifier for multiplexing multiple input signals to produce an output with minimal distortion associated with switching.

BACKGROUND

Multiple channel selection circuits are used in a wide variety of applications, for example in analog video channel multiplexing for picture-in-picture displays or infrared imaging sensors. In such applications, different analog signals are individually selected for output.

Several arrangements have been proposed to select individual signals for output. Typical switching arrangements employ individual switches within the signal paths of each input signal.

Referring to FIG. 1A, for example, a conventional switching arrangement may include multiple input signals INPUTS A–D, respective switches SA–SD, and a buffering feedthrough operational amplifier (op-amp) BOA. Complementary Metal Oxide Semiconductor Field Effect Transistors (CMOSFETs) may be used to implement the switches SA–SD. The switches SA–SD are individually enabled by enable signals EN1, EN1*, EN2, EN2*, EN3, EN3* and EN4, EN4* generated by, for example, a Timing Generator with various logic components. The input signals INPUTS A–D are individually selected by the switches SA–SD. When closed, the switches provide current paths for the input signals INPUTS A–D to be conducted and charge the stray capacitance at the input of the op-amp, BOA. The input signal selected by the switches is fed through the op-amp BOA and output as an output voltage, $V_{OUT}$.

FIGS. 1B and 1C illustrate in detail the configuration of a typical CMOS switch employed in a signal path. In the illustrated example, the configuration of the CMOS switch SA depicted in FIG. 1A is shown in detail. Referring to FIG. 1B, the CMOS switch SA comprises parallel-connected complementary MOSFETs. Enable signals EN1 and EN1* are input at the gates of the MOSFETs to activate the switch SA and select the corresponding input signal INPUT A. Referring to FIG. 1C, the two MOSFETs are N and P channel MOS transistors, with parasitic capacitances CGD and CGS across the gates of the MOSFETs. The two complementary MOSFETs form a switch that is essentially an open circuit from one end to the other when the N channel's gate is a logic low and the P channel's gate is a logic high. To turn the switch SA on, the enable signal EN1 is applied at a high logic level to the N channel and the enable signal EN1* is applied at a low logic level at the P channel.

The variable resistances RP and RN represent the finite resistances of each MOSFET when it is turned on, somewhere in the 1 KΩ to 10 KΩ range, depending on the geometry of the MOSFET and the process parameters which determine the resistance range. The resistances of the MOSFETs are non-linear because they are a function of the magnitude of the current which passes through them, which depends on the charge on the capacitance and the voltage across the capacitances CGD and CGS. These non-linear resistances cause distortions in the selected signal.

FIG. 2 depicts a timing diagram illustrating the operation of the conventional switching arrangement depicted in FIG. 1A. Referring to FIG. 2, when the enable signal EN1 is high and EN1* is low, $V_{OUT}$ corresponds to INPUT A. When the enable signal EN2 is high and EN2* is low, $V_{OUT}$ corresponds to INPUT B. When the enable signal EN3 is high and EN3* is low, $V_{OUT}$ corresponds to INPUT C. Finally, when the enable signal EN4 is high and EN4* is low, $V_{OUT}$ corresponds to INPUT D. This operation is also shown in Table I below.

TABLE I

| EN1 | EN1* | EN2 | EN2* | EN3 | EN3* | EN4 | EN4* | Vout |
|---|---|---|---|---|---|---|---|---|
| 1 | 0 | 0 | 1 | 0 | 1 | 0 | 1 | INPUT A |
| 0 | 1 | 1 | 0 | 0 | 1 | 0 | 1 | INPUT B |
| 0 | 1 | 0 | 1 | 1 | 0 | 0 | 1 | INPUT C |
| 0 | 1 | 0 | 1 | 0 | 1 | 1 | 0 | INPUT D |

Conventional switching arrangements such as that depicted in FIG. 1A employ separate switches for each of the input signals INPUTS A–D. A problem with such arrangements is that capacitive coupling may occur between the input enable signals EN1–EN4* and the input signals INPUTS A–D through the stray capacitances CGD and CGS. This capacitive coupling creates non-linearities which may cause significant distortion in the output signal. Also, a non-linear resistance appears across each switch, creating a source of additional non-linearities which further distort the output signal.

In an effort to reduce these negative effects, another switching arrangement has been proposed, in which input signals are input into differential transistor amplifiers, and the differential amplifiers are individually selected using a current steering long tail switch. The current steering long tail switch steers the current from a long tail current source, which ideally operates electrically like a long rope or tail to pull down on the common sources of a differential amplifier, causing that differential amplifier to produce a signal corresponding to the input signal. The differential amplifiers and the current steering long tail switch are arranged within an operational amplifier loop, and signal selection is performed within the op-amp. Non-linearities caused by capacitive coupling and non-linear resistance are attenuated by an amount equal to the open loop gain of the op-amp. However, this arrangement is typically implemented with bipolar transistors, requiring a complex configuration of blocking diodes, switches and resistors for optimum performance. Furthermore, the current steering long tail switch is typically implemented with a single bipolar transistor, which has a high transconductance but causes capacitive coupling due to the edge coupling from the base of the transistor to the collector of the transistor, resulting in a distorted output signal from charge coupling back to the input.

Thus, there is a need for a multiple input channel selection system that eliminates the distortion in an output signal caused by switching without requiring complex circuitry.

SUMMARY

According to the present invention, a method and an apparatus are provided for multiplexing multiple input signals to produce an output in which the distortion associated with switching is minimized. Selection of the multiple input signals is performed within a multiplexing operational amplifier. The operational amplifier includes differential amplifiers that receive the respective input signals at their respective noninverting nodes. The differential amplifiers are connected to a feedback signal at their respective inverting nodes. The input signals are selected for output by turning on selection switches within the operational amplifier, causing the respective differential amplifier to be selected. This minimizes non-linearities in the output due to capacitive coupling and eliminates unwanted resistive effects without requiring complicated circuitry.

According to one embodiment, the selection switches include complementary back-to-back MOSFETs. The complementary switches cancel the capacitive coupling and switch feedthrough within the multiplexing op-amp.

According to an alternative embodiment, the selection switches include a pair of same-channel MOSFETs connected in series. One of the MOSFETs in each switch is shorted, cancelling the capacitive coupling and switch feedthrough caused by the switch.

BRIEF DESCRIPTION OF THE DRAWINGS

FIG. 9a illustrates in detail the exemplary 4-to-1 multiplexing operational amplifier depicted in FIG. 8 according to one embodiment of the present invention;

FIG. 9b illustrates in detail an exemplary 4-to-1 multiplexing operational amplifier according to an alternative embodiment of the present invention;

DETAILED DESCRIPTION

Figure 1A:
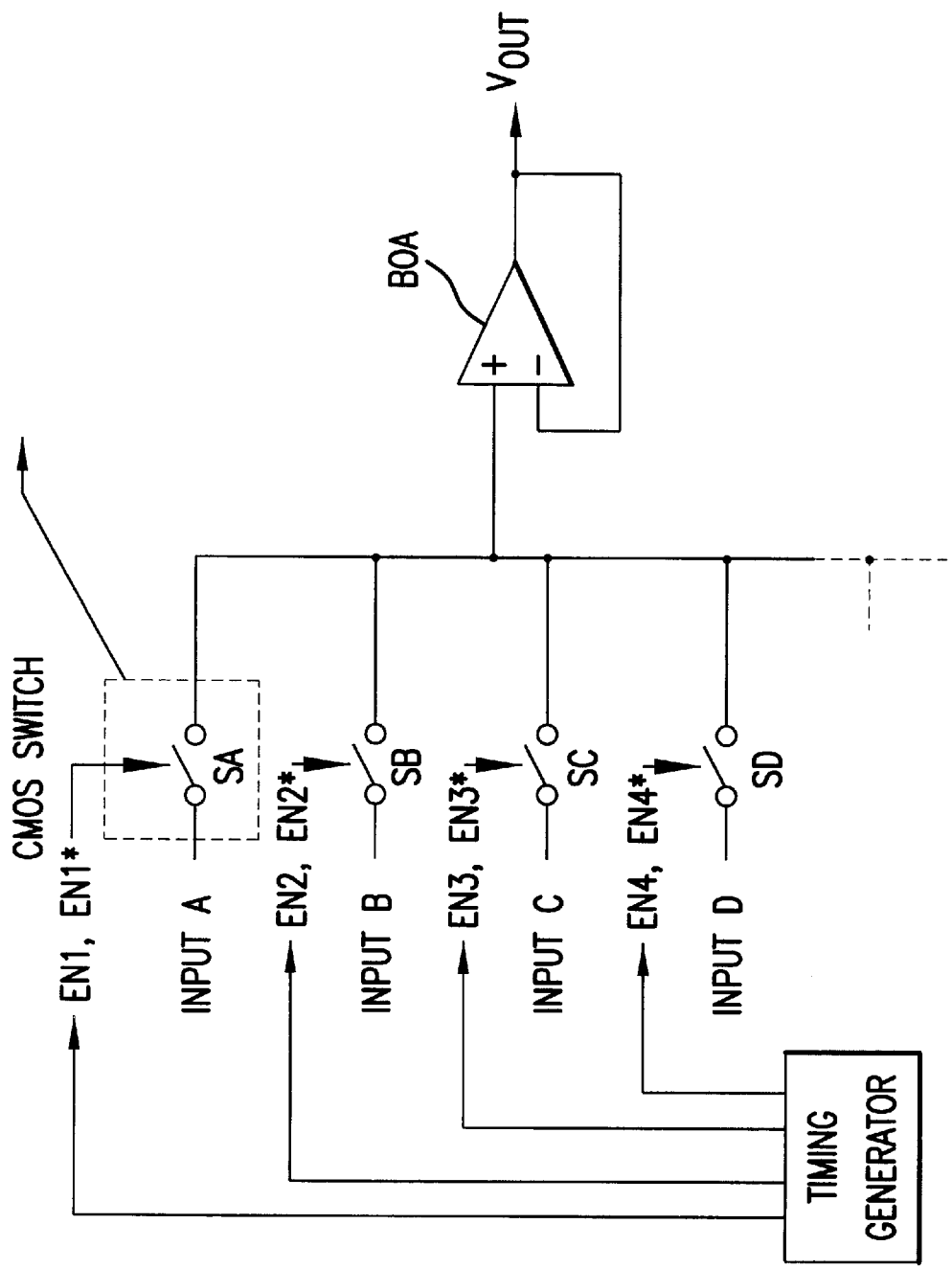
FIGS. 1A–1C depict a conventional switching arrangement.
Figure 1C:
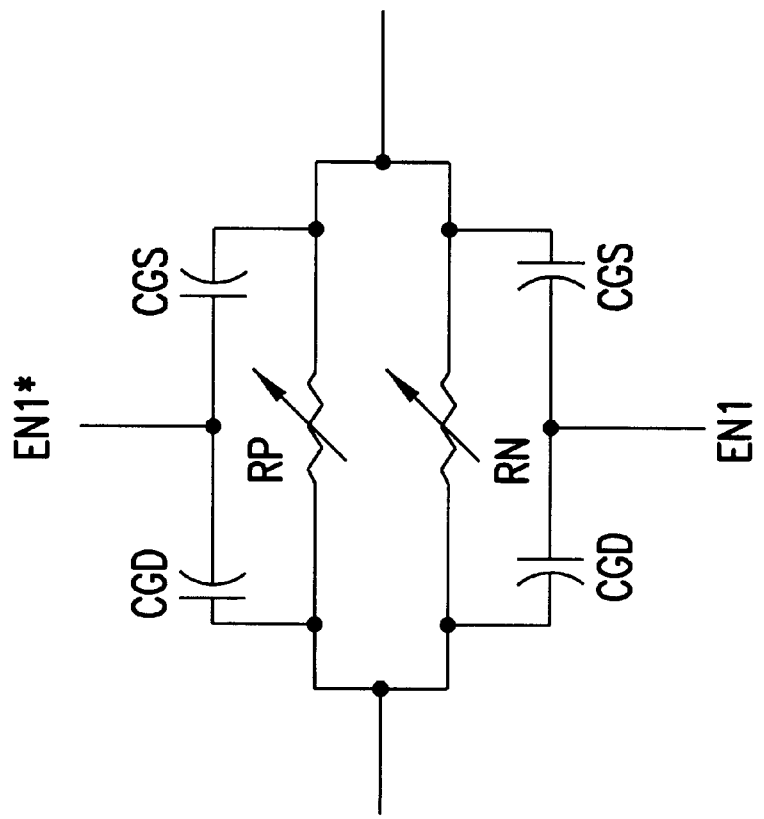
Figure 1B:
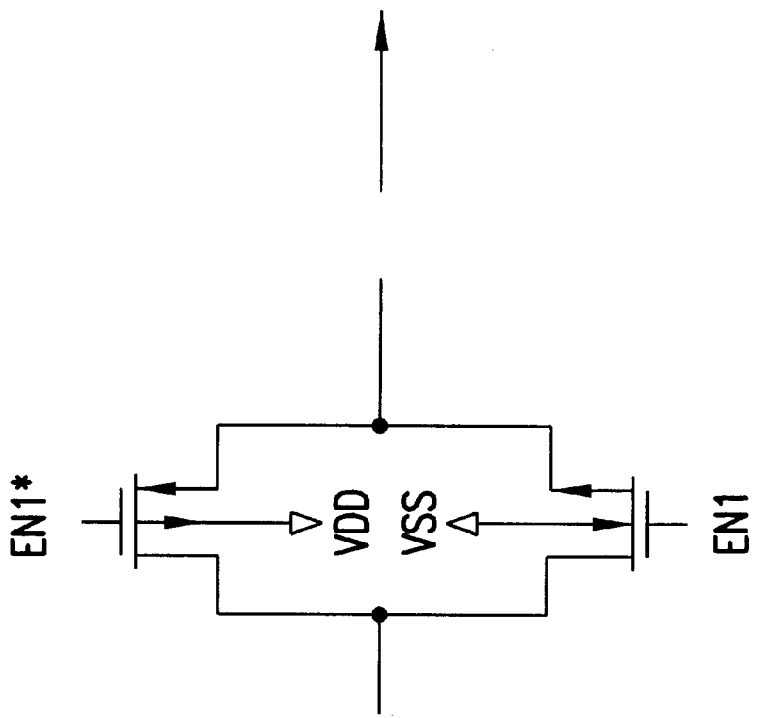
Figure 2:
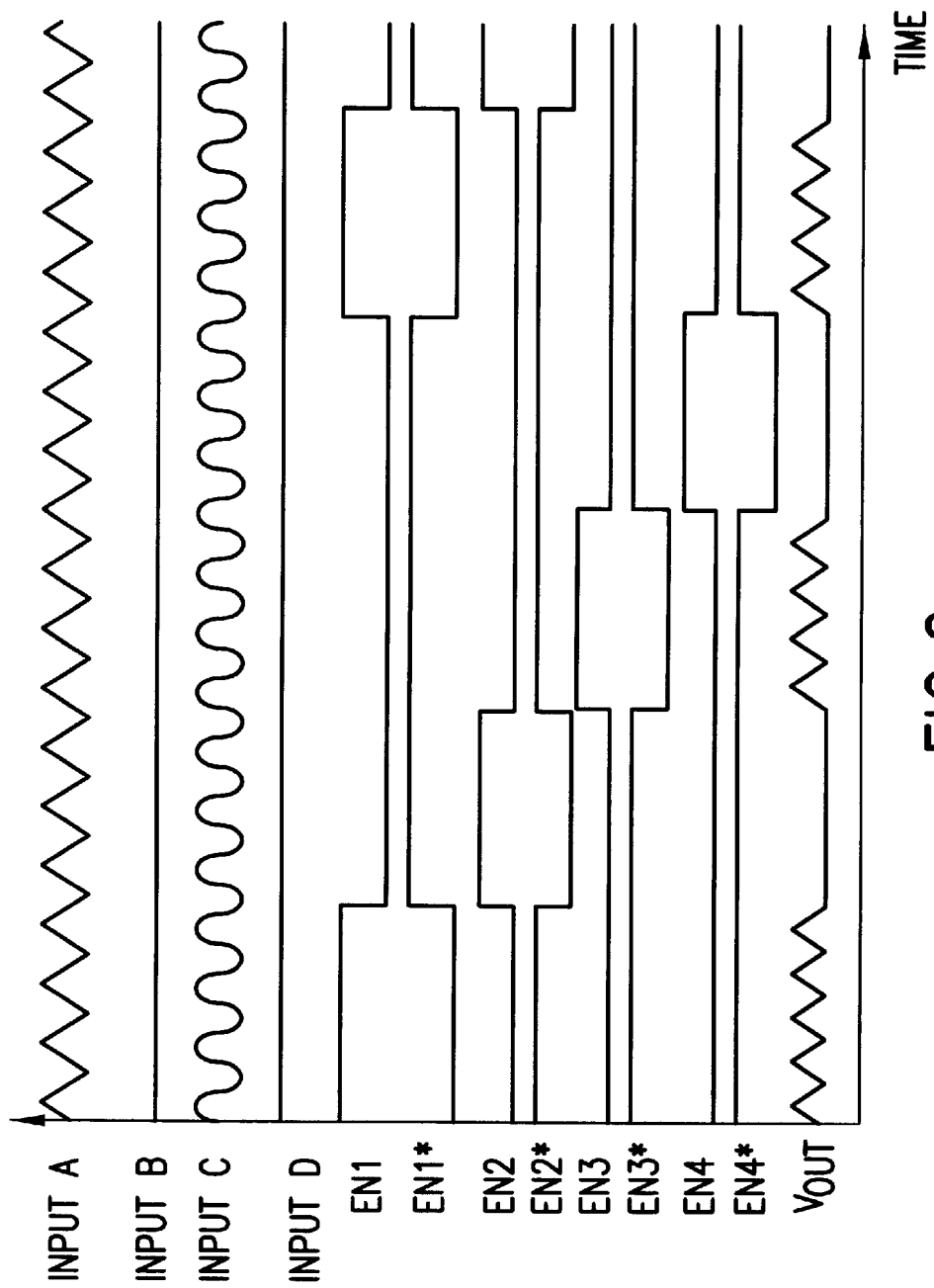
FIG. 2 depicts a timing diagram illustrating the operation of the conventional switching arrangement depicted in FIG. 1A.
Figure 3:
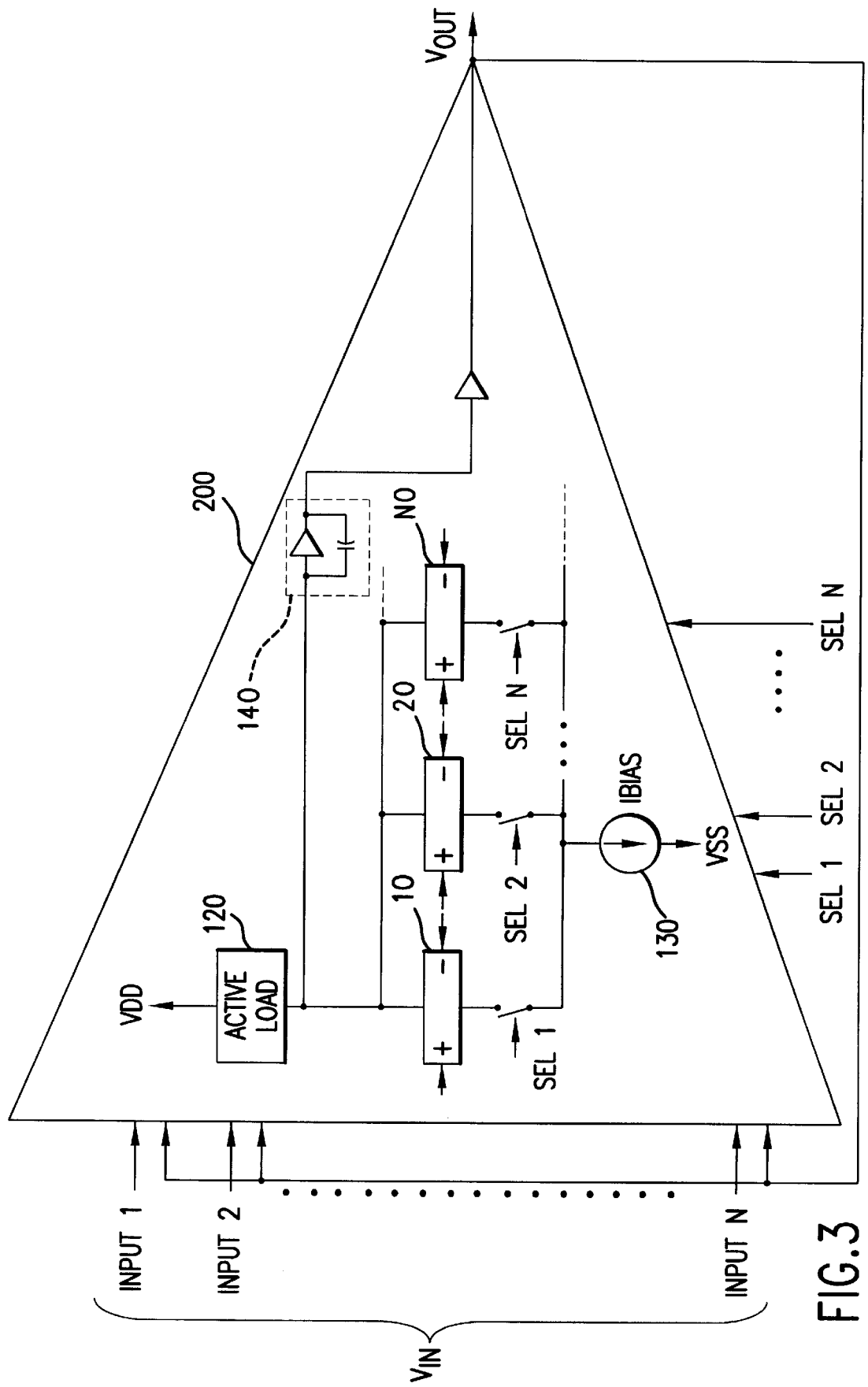
FIG. 3 illustrates a model of an exemplary multiplexing operational amplifier according to the present invention.

FIG. 3 illustrates a simple model of a multiplexing op-amp according to the present invention. As shown in FIG. 3, an output signal $V_{OUT}$ is selected among multiple input signals INPUTS 1–N within an op-amp 200, eliminating the need for switches in the individual input signal paths. The op-amp 200 includes multiple differential amplifiers 10, 20 . . . N0. The input signals INPUTS 1–N are input at the noninverting nodes of the differential amplifiers 10, 20 . . . N0, respectively. A feedback signal connected to the output signal $V_{OUT}$ is input at the inverting nodes the differential amplifiers 10, 20 . . . N0. The differential amplifiers form differential signals of the input signals INPUTS 1–N and the feedback signal.

The multiplexing action of the op-amp 200 is achieved by selecting one of the differential amplifiers 10, 20 . . . N0 to conduct a respective input signal via switches activated by select signals SEL 1 . . . SEL N. The select signals SEL 1 . . . SEL N may be generated, for example, by a timing generator. When activated by the select signals SEL 1 . . . SEL N, the switches close to permit current to flow from a current source 130, for example, a common bias current sink IBIAS, connected to a voltage VSS. The switches simply select the desired differential amplifier to conduct a signal current in response to the select signals SEL 1 . . . SEL N.

An active load 120 connected to a voltage VDD is connected to the selected differential amplifier to provide a high output resistance that maximizes the open loop gain "A" provided by an amplifier stage 140 in the op-amp 200. After being fed through the amplifier stage 140, the signal conducted by the selected differential amplifier is output as $V_{OUT}$.

Once a differential amplifier is selected, its signal is maintained by the closed loop configuration of the op-amp 200, thus minimizing non-linear distortion in the output signal. This closed loop configuration is formed by the feedback from the output $V_{OUT}$, which is connected to the inverting nodes of the differential amplifiers 10, 20 . . . N. Referring to FIG. 3, the closed loop gain of the op-amp 200 is "A÷(1+A)", where "A" is the open loop gain of the amplifier stage 140 within the op-amp 200. Assuming there is no attenuation in the feedback, the relationship between an input voltage $V_{IN}$ and the output voltage $V_{OUT}$ is then:

$$V_{OUT}/V_{IN}=A/(1+A)$$

It is clear that any non-linearity that may result due to the switches is minimized by selecting the signal output inside the loop. The non-linear distortion is further minimized by maximizing the open loop gain A.

The multiplexer may be implemented with a conventional op-amp with multiple differential amplifiers and switches. The differential amplifiers and switches may be constructed of, for example, 1.2μ, double metal, double poly, CMOS-FETs.

The switches used in the arrangement depicted in FIG. 3 preferably operate in a current mode, simply passing the current generated by the current source 130 when they are on. This avoids the unwanted resistive effects and resulting non-linearities that would arise if the switches were operated in a voltage mode. Although there may be some non-linear distortion due to the switches even when operated in a current mode, this is removed by the open loop gain of the op-amp 200.

Figure 4:
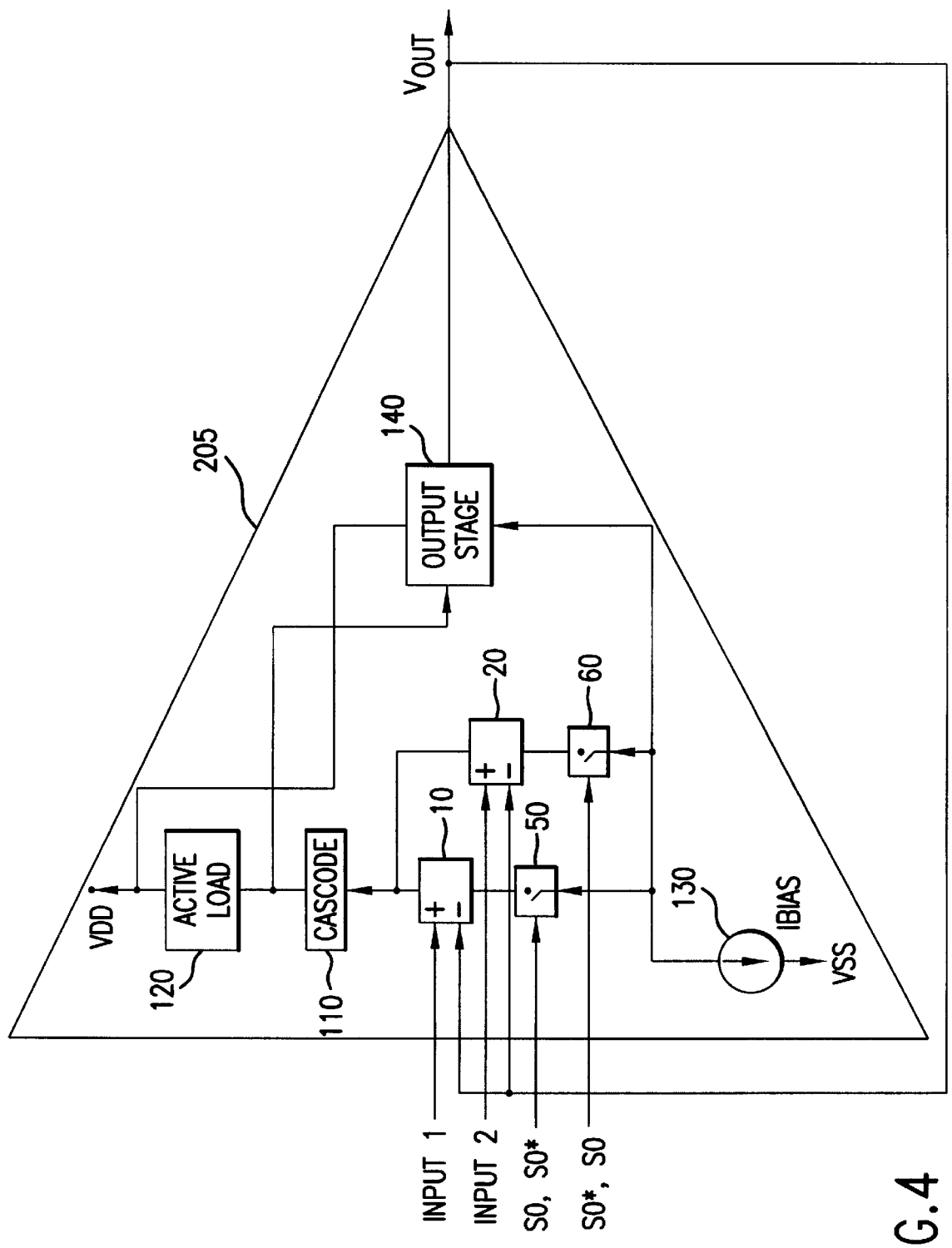
FIG. 4 illustrates an exemplary 2-to-1 multiplexing operational amplifier according to the present invention.

FIG. 4 illustrates an exemplary 2-to-1 multiplexing operational amplifier according to the present invention. As shown in FIG. 4, the multiplexing op-amp 205 selects between the inputs INPUT 1 and INPUT 2 to produce the output signal $V_{OUT}$. The op-amp 205 includes differential amplifiers 10 and 20. The input signals INPUT 1 and INPUT 2 are input at the noninverting nodes of the differential amplifiers 10 and 20, respectively. A feedback signal connected to the output signal $V_{OUT}$ is input at the inverting nodes of the differential amplifiers 10 and 20.

The differential amplifiers 10 and 20 are selected by activating the switches 50 and 60 in response to select signals S0 and S0*, where S0 and S0* are equal in magnitude but opposite in polarity. When S0 is high and S0* is low, the switch 50 is activated. When S0 is low and S0* is high, the switch 60 is activated. Activating the switch 50 enables the current from the current source 130 to flow and turn on the differential amplifier 10 to produce a signal corresponding to the input signal INPUT 1. Similarly, activating the switch 60 enables the current to flow from the current source 130 and turn on the differential amplifier 20 to produce a signal corresponding to the input signal INPUT 2.

The signal produced by the selected differential amplifier is fed through a cascode pair 110 that isolates the differential amplifiers 10 and 20 from the active load 120. The cascode pair buffers the signal produced by the selected differential amplifier from the voltage swings caused by the active load that would modulate the output and in turn cause a current imbalance and offset in the output. Also, the cascode pair 110 increases the output resistance to provide a higher open loop gain, which in turn reduces non-linearities in the output.

The signal produced by the selected differential amplifier is fed through the cascode circuit 110 to an output stage 140 that is powered by the current source 130. Then the signal is output as a voltage, $V_{OUT}$.

Figure 5A:
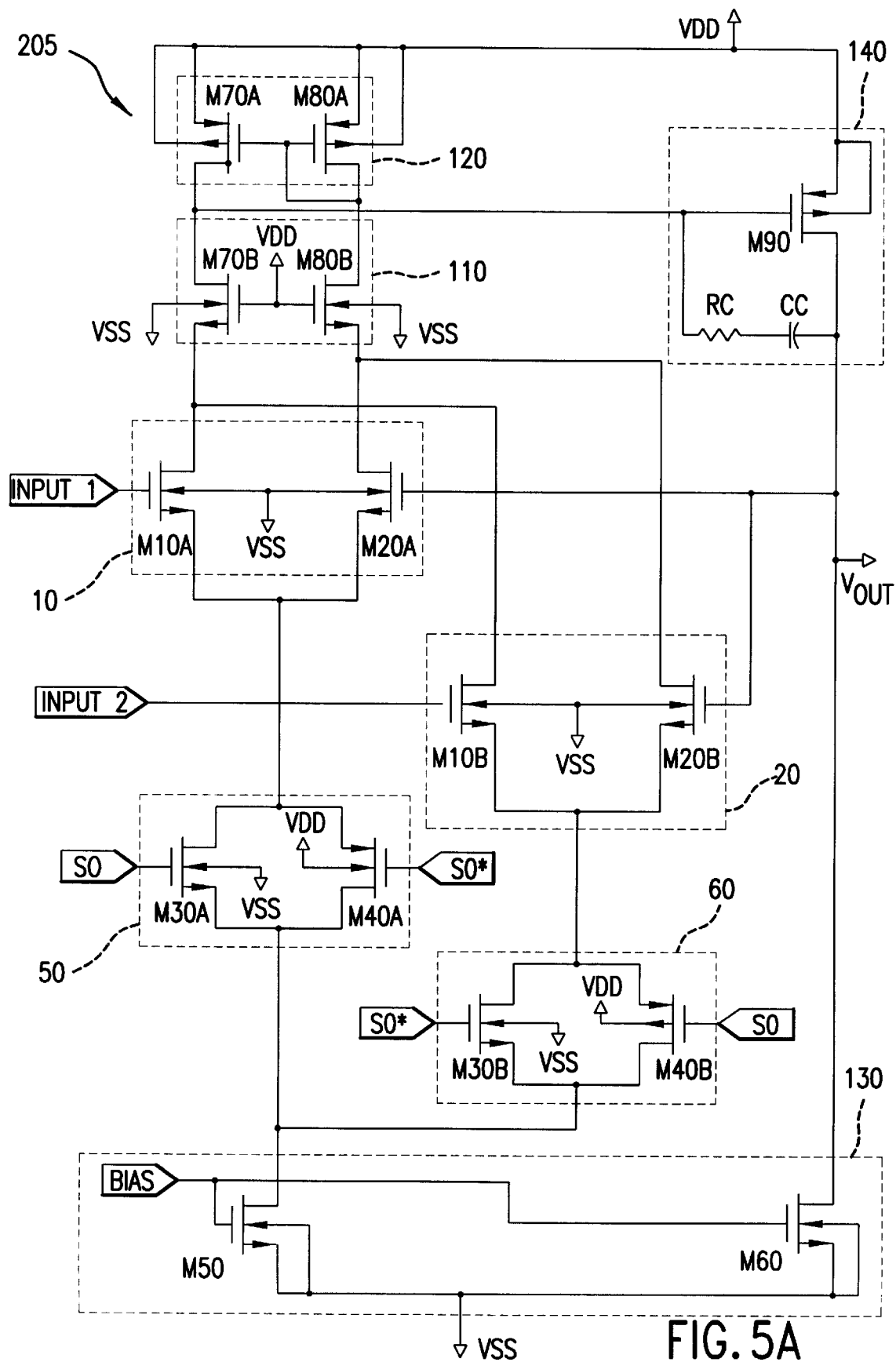
FIG. 5a illustrates in detail the exemplary 2-to-1 multiplexing operational amplifier depicted in FIG. 4 according to one embodiment of the present invention.

FIG. 5a illustrates in detail the exemplary 2-to-1 multiplexing op-amp depicted in FIG. 4 according to one embodiment of the present invention. Referring to FIG. 5a, input voltages INPUT 1 and INPUT 2 are input into the noninverting nodes of the differential amplifiers 10 and 20, respectively. The feedback voltage $V_{OUT}$ is connected to the respective inverting nodes of the differential amplifiers 10 and 20. Amplifier 10 comprises MOSFETs M10A and M20A into which INPUT 1 and the feedback are fed, respectively. Amplifier 20 comprises MOSFETs M10B and M20B into which INPUT 2 and the feedback are fed, respectively. The drains of the amplifiers are connected to the active load 120 comprising a common cascode current mirror formed of MOSFETs M70A and M80A via a cascode pair 110 comprising the MOSFETs M70B and M80B. The current mirror 120 acts as the common active load for the selected differential amplifier, forcing equal currents through each drain of the differential amplifier from the current source 130, so that the current is distributed evenly through the selected differential amplifier.

Select switches 50 and 60 are connected to the sources of each of the differential amplifiers 10 and 20 to select the differential amplifiers. Switch 50 comprises back-to-back complementary MOSFETs M30A and M40A, and switch 60 comprises back-to-back complementary MOSFETs M30B and M40B. Switch 50 selects the differential amplifier 10 in response to the select signal S0 input at a high level into the gate of MOSFET M30A and the select signal S0* input at a low level into the gate of MOSFET M40A. Switch 60 selects the differential amplifier 20 in response to the select signal S0* input at a high level into the gate of the MOSFET M30B and S0 input at a low level into the gate of MOSFET 40B. By using complementary back-to-back MOSFETs, the capacitive coupling of the select signals, S0 and S0*, to the input signals INPUT 1 and INPUT 2 and the feedback signal is cancelled out because the two select signals are opposite in polarity. Thus, using the complementary back-to-back MOSFETs cancels the effects of capacitive coupling and switch feedthrough.

The signal produced by the selected differential amplifier is fed through an output stage 140 before being output from the op-amp. The output stage 140 may comprise, for example, a simple high gain Class A output stage, including a MOSFET M90, a resistor RC, and a capacitor CC. The Class A output stage operates at a constant bias current, providing linear operation. This is achieved by establishing a quiescent point at the gate of the MOSFET M90 that produces an output voltage $V_{OUT}$ equal to the input voltage corresponding to the signal produced by the selected differential amplifier. Any difference between the input voltage and the output voltage $V_{OUT}$ will result in a difference current in the output, thus causing a change at the gate of the MOSFET M90. The MOSFET M90 will respond to the change on its gate to change the output voltage so that the output voltage will be approximately equal to the input voltage.

The current source 130 may include a current source such as a long tail current source comprising a MOSFET M50 for powering the differential amplifiers and switches. The current source 130 may also include a current source such as a MOSFET M60 for powering the output stage 140 of the op-amp.

Figure 5B:
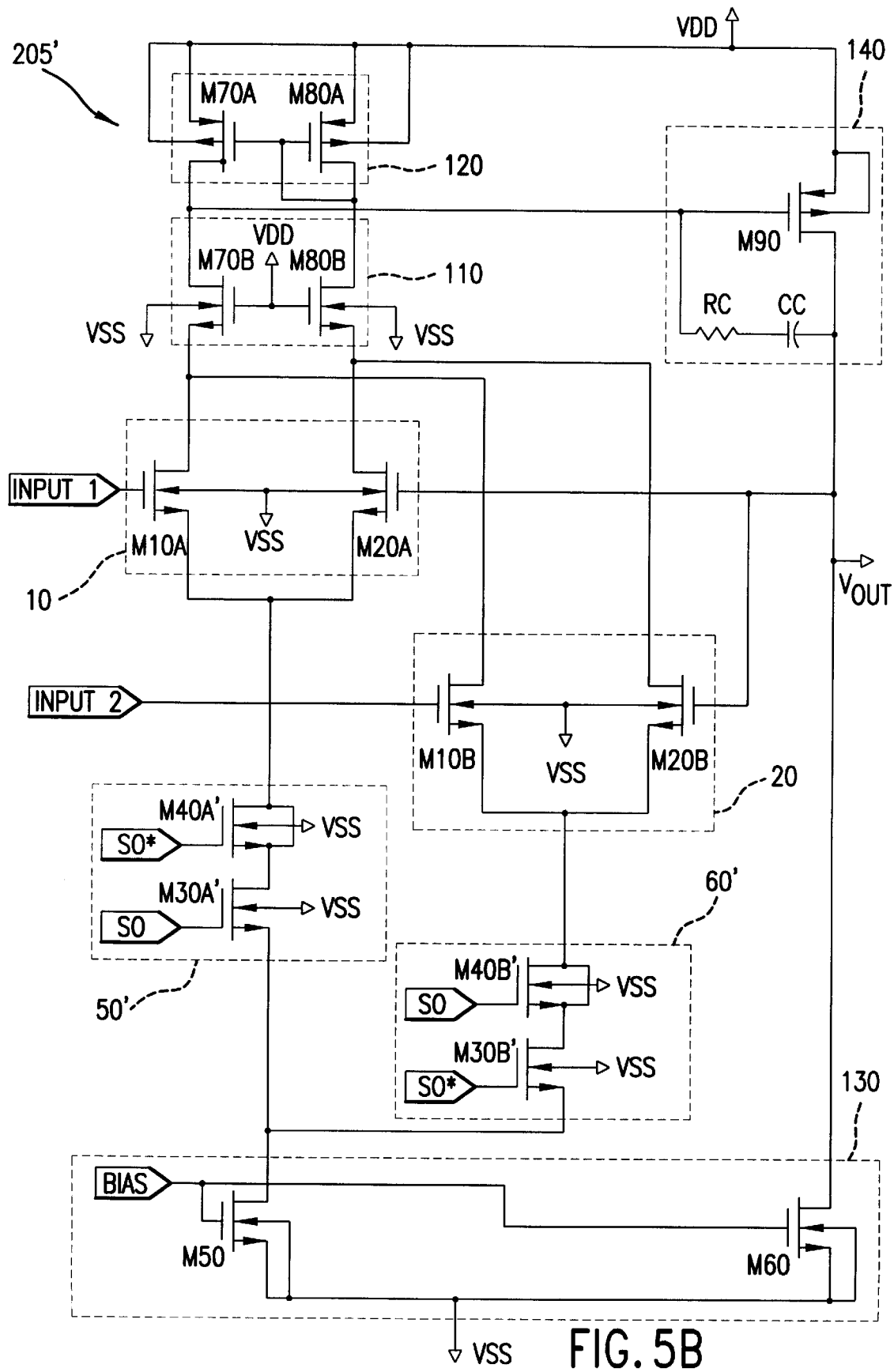
FIG. 5b illustrates in detail an exemplary 2-to-1 multiplexing operational amplifier according an alternative embodiment of the present invention.

FIG. 5b illustrates in detail an exemplary 2-to-1 multiplexing operational amplifier according to an alternative embodiment of the present invention. The multiplexing operational amplifier 205' shown in FIG. 5b is similar to that shown in FIG. 5a, except that the switches 50 and 60 are replaced with switches 50' and 60', respectively. The switches 50' and 60' are connected to the sources of each of the differential amplifiers 10 and 20 to select the differential amplifiers.

Switch 50' comprises same-channel MOSFETs M30A' and M40A' connected in series, and switch 60' comprises same-channel MOSFETs M30B' and M40B' connected in series. Switch 50' selects the differential amplifier 10 in response to the select signal S0 input at a high level into the gate of MOSFET M30A' and the select signal S0* input at a low level into the gate of MOSFET M40A'. Switch 60' selects the differential amplifier 20 in response to the select signal S0* input at a high level into the gate of the MOSFET M30B' and S0 input at a low level into the gate of the MOSFET 40B'. The MOSFETS M40A' and M40B' are shorted. By using a pair of same-channel MOSFETs connected in series, with one of the MOSFETS shorted, the capacitive coupling of the select signals, S0 and S0*, to the input signals INPUT 1 and INPUT 2 and the feedback signal is cancelled out because the two select signals are opposite in polarity. Thus, using a pair of same-channel MOSFETs connected in series cancels the effects of capacitive coupling and switch feedthrough.

Figure 6:
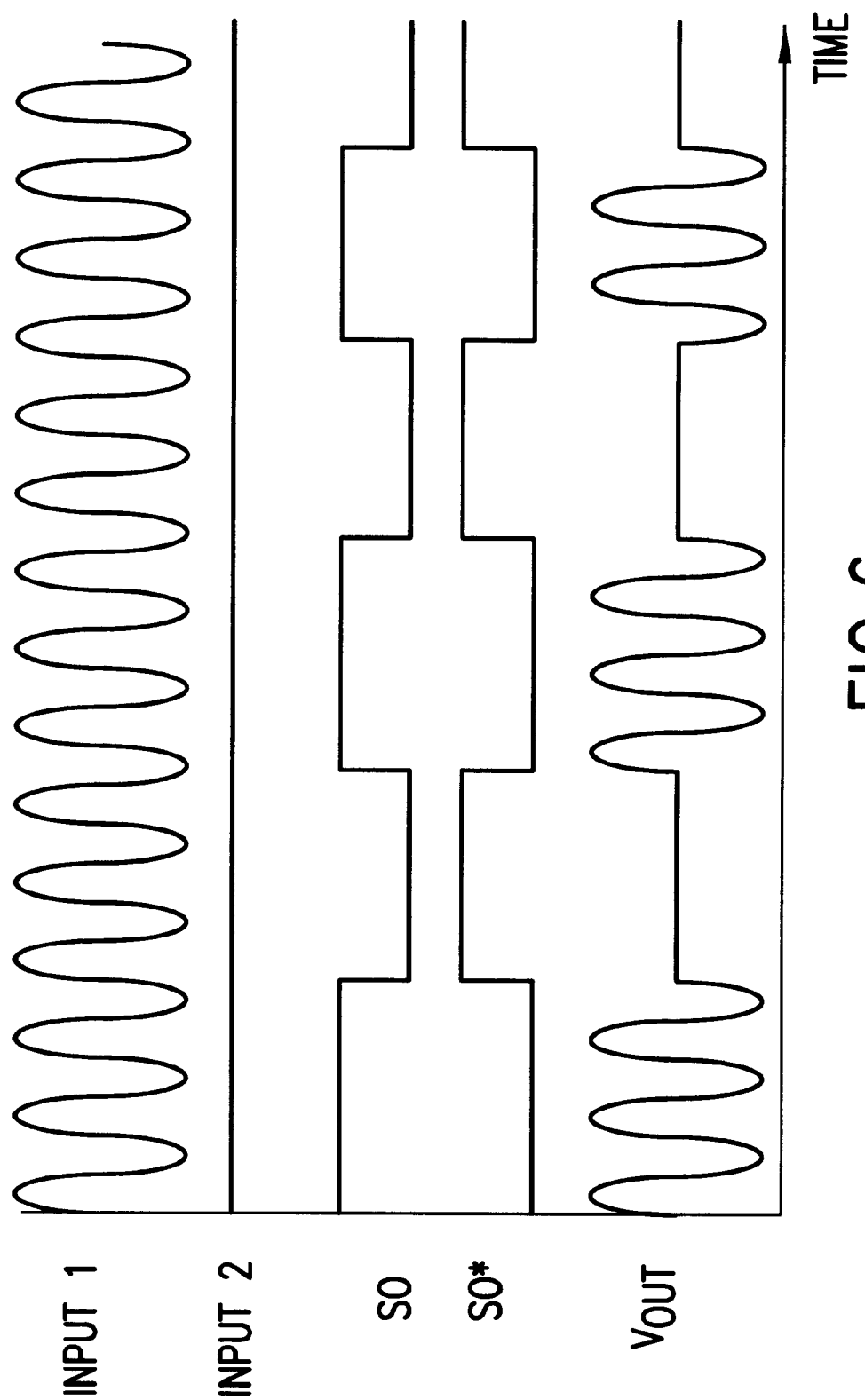
FIG. 6 depicts a timing diagram demonstrating the operation of the exemplary 2-to-1 multiplexing operational amplifier depicted in FIGS. 4, 5a and 5b.

FIG. 6 depicts a timing diagram demonstrating the operation of the exemplary 2-to-1 multiplexing operational amplifier depicted in FIGS. 4 and 5. Referring to FIG. 6, when the select signal S0 is high and S0* is low, $V_{OUT}$ corresponds to INPUT 1 to the differential amplifier 10. When the select signal S0 is low and S0* is high, $V_{OUT}$ corresponds to INPUT 2 to the differential amplifier 20. This operation is also shown in Table II below.

TABLE II

| S0 | S0* | $V_{OUT}$ |
|---|---|---|
| 1 | 0 | INPUT 1 |
| 0 | 1 | INPUT 2 |

Figure 7:
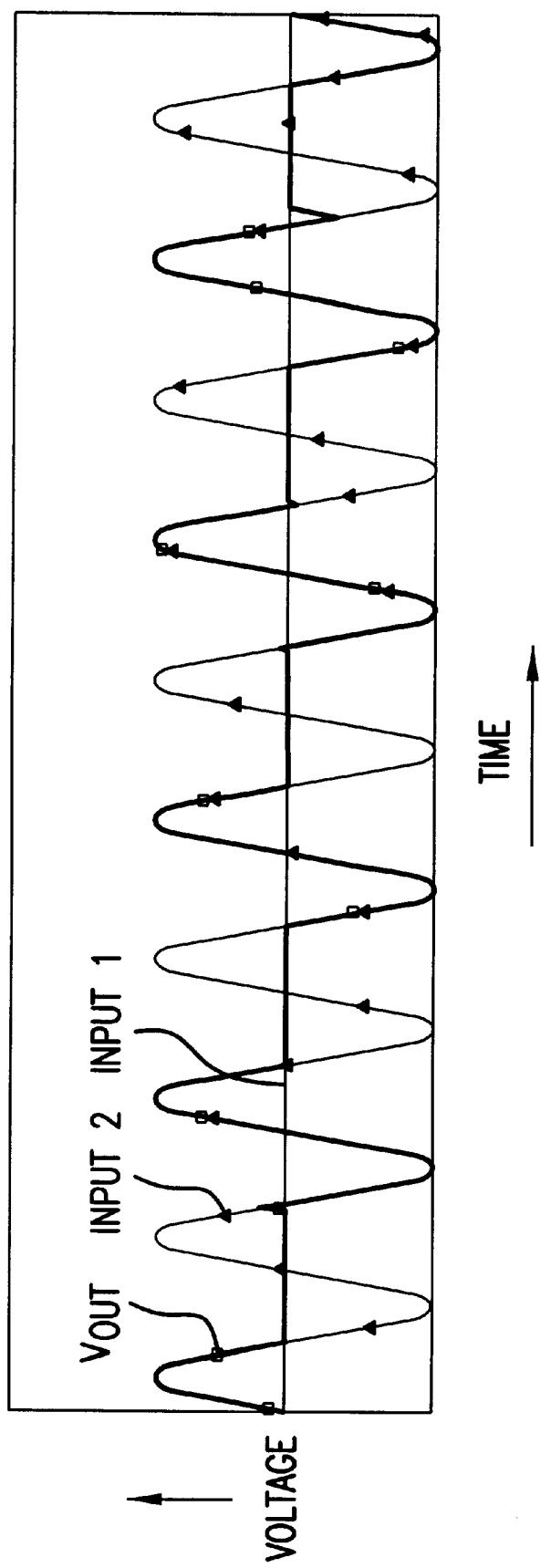
FIG. 7 illustrates exemplary transient response simulations of the exemplary 2-to-1 multiplexing op-amps.

FIG. 7 illustrates exemplary transient response simulations of the 2-to-1 multiplexing op-amp shown in FIGS. 4, 5a and 5b. In FIG. 7, the input voltages, INPUT 1 and INPUT 2, and the output voltage, $V_{OUT}$, resulting from the selection of the differential amplifiers, are plotted over time. Referring to FIG. 7, INPUT 1 is represented by a sinusoidal line marked with triangles, INPUT 2 is represented by a straight line marked with diamonds, and $V_{OUT}$ is represented by a line marked with squares. From FIG. 7, it is apparent that the output voltage $V_{OUT}$ follows the input voltages INPUT 1 and INPUT 2 as they are respectively selected.

Figure 8:
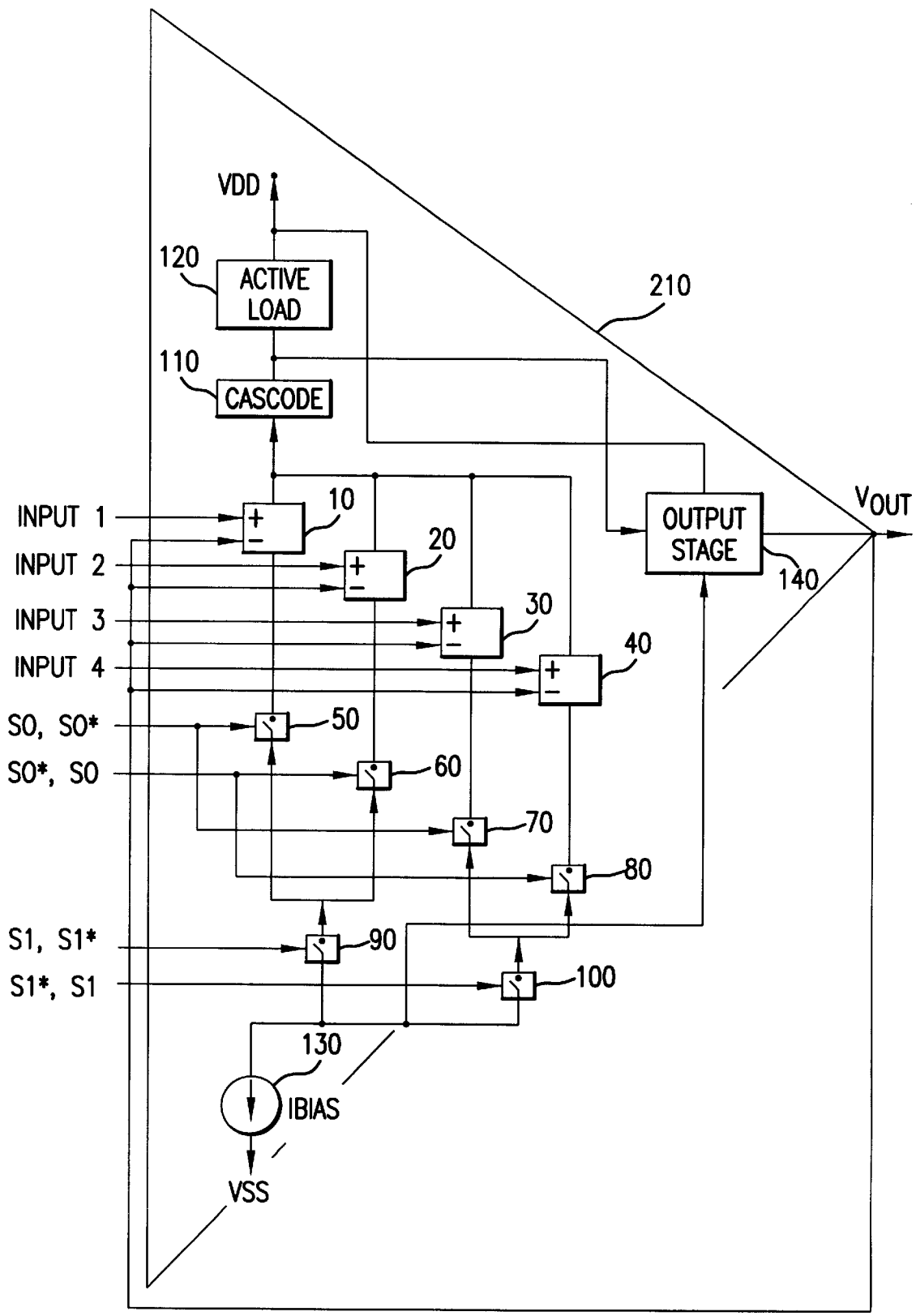
FIG. 8 illustrates an exemplary 4-to-1 multiplexing operational amplifier according to the present invention.

The multiplexing op-amp design according to the present invention can be easily expanded from two input signals to any desired number of input signals. For example, FIG. 8 depicts an exemplary 4-to-1 multiplexing op-amp according to the present invention. As shown in FIG. 8, the multiplexing op-amp 210 selects from among four input signals, INPUTS 1–4 to produce the output signal $V_{OUT}$. The op-amp 210 includes four differential amplifiers 10, 20, 30 and 40. The input signals INPUT 1–4 are input at the noninverting nodes of the differential amplifiers 10–40, respectively. A feedback signal connected to the output signal $V_{OUT}$ is input at the inverting nodes of the differential amplifiers 10–40.

The differential amplifiers 10–40 are selected by activating the switches 50–80 in response to select signals S0 and S0* and activating the switches 90 and 100 in response to select signals S1 and S1*. The select signals S0 and S0* are equal in magnitude but opposite in polarity. The select signals S1 and S1* are also equal in magnitude but opposite in polarity, and do not overlap the select signals S0 and S0*. When S0 is high and S0* is low, the switches 50 and 70 are activated. When S0 is low and S0* is high, the switches 60 and 80 are activated. When S1 is high and S1* is low, the switch 90 is activated. When S1 is low and S1* is high, the switch 100 is activated.

Activating the switches 50 and 90 enables the current from the current source 130 to flow and turn on the differential amplifier 10 to produce a signal corresponding to the input signal INPUT 1. Similarly, activating the switches 60 and 90, 70 and 100, and 80 and 100 enables the current to flow from the current source 130 and turn on the differential amplifiers 20, 30, and 40, respectively, to produce signals corresponding to the input signals INPUT 2, INPUT 3 and INPUT 4, respectively.

The selected differential amplifiers 10, 20, 30 and 40 produce outputs corresponding to INPUT 1, INPUT 2, INPUT 3, and INPUT 4, respectively. The signal produced by the selected differential amplifier is fed through a cascode pair 110 that isolates the differential amplifiers 10–40 from the active load 120. The signal produced by the differential amplifier is fed through the cascode circuit 110 to an output stage 140 that is powered by the current source 130. Then the signal is output as a voltage, $V_{OUT}$.

FIG. 9a illustrates in detail the exemplary 4-to-1 multiplexing op-amp depicted in FIG. 8 according to one embodiment of the present invention. Referring to FIG. 9a, four input voltages INPUT 1, INPUT 2, INPUT 3 and INPUT 4 are input into the noninverting nodes of the differential amplifiers 10, 20, 30 and 40, respectively. The feedback voltage $V_{OUT}$ is connected to the respective inverting nodes of the differential amplifiers 10–40. As in FIG. 5a, amplifier 10 comprises MOSFET M10A and M20A into which INPUT 1 and the feedback are fed, respectively. Amplifier 20 comprises MOSFETs M10B and M20B, into which INPUT 2 and the feedback are fed, respectively. Amplifier 30 comprises MOSFETs M10C and M20C, into which INPUT 3 and the feedback are fed, respectively. Amplifier 40 comprises MOSFETs M10D and M20D into which INPUT 4 and the feedback are fed, respectively.

Four switches 50, 60, 70 and 80 are connected to the sources of the differential amplifiers 10, 20, 30 and 40, respectively. Switches 50, 60, 70, and 80 comprise back-to-back complementary MOSFETs M30A and M40A, M30B and M40B, M30C and M40C, and M30D and M40D, respectively. Switches 50 and 60 are in turn connected to a switch 90 comprising back-to-back complementary MOSFETs M30E and M40E. Switches 70 and 80 are in connected to a switch 100 comprising back-to-back complementary MOSFETs M30F and M40F.

The differential amplifiers 10–40 are selected as follows. Switches 50 and 90 select the differential amplifier 10 in response to select signals S1 and S0 input at a high level at the gates of MOSFETs M30E and M30A and select signals S1* and S0* input at a low level at the gates of MOSFETs M40E and M40A, respectively. Switches 60 and 90 select the differential amplifier 20 in response to the select signals S1 and S0* input at a high level at the gates of MOSFETs M30E and M30B and select signals S1* and S0 input at a low level at the gates of MOSFETs M40E and M40B, respectively. Switches 70 and 100 select the differential amplifier 30 in response to the select signals S1* and S0 input at a high level at the gates of MOSFETs M30F and M30C and select signals S1 and S0* input at a low level at the gates of MOSFETs M40F and M40C, respectively. Finally, switches 80 and 100 select the differential amplifier 40 in response to the select signals S1* and S0* input at a high level at the gates of MOSFETs M30F and M30D and select signals S1 and S0 input at a low level at the gates of MOSFETs M40F and M40D, respectively. The complementary MOSFETs cancel the effects of capacitive coupling of the select signals S0, S0*, S1 and S1*, to the input signals INPUTS 1–4 and the feedback signal, thereby cancelling switch feedthrough.

FIG. 9b illustrates in detail an exemplary 4-to-1 multiplexing operational according to an alternative embodiment of the present invention. The multiplexing operational amplifier 210' shown in FIG. 9b is similar to that shown in FIG. 9a, except that the switches 50, 60, 70, 80, 90 and 100 are replaced with switches 50', 60', 70', 80', 90', and 100', respectively. The switches 50' and 60', 70' and 80' are connected to the sources of the differential amplifiers 10, 20, 30 and 40, respectively.

Switches 50', 60', 70', and 80' each comprise a pair of same-channel MOSFETs connected in series. Switch 50' comprises MOSFETs M30A' and M40A', switch 60' comprises MOSFETs M30B' and M40B', switch 70' comprises MOSFETs M30C' and M40C', and switch 80' comprises MOSFETs M30D' and M40D', respectively. Switches 50' and 60' are in turn connected to a switch 90' comprising a pair of same-channel MOSFETs M30E' and M40E' connected in series. Switches 70' and 80' are turn connected to a switch 100' comprising a pair of same-channel MOSFETs M30F' and M40F' connected in series.

The differential amplifiers 10–40 are selected as follows. Switches 50' and 90' select the differential amplifier 10 in response to select signals S1 and S0 input at a high level at the gates of MOSFETs M30E' and M30A' and select signals S1* and S0* input at a low level at the gates of MOSFETs M40E' and M40A', respectively. Switches 60' and 90' select the differential amplifier 20 in response to the select signals S1 and S0* input at a high level at the gates of MOSFETs M30E' and M30B' and select signals S1* and S0 input at a low level at the gates of MOSFETs M40E' and M40B', respectively. Switches 70' and 100' select the differential amplifier 30 in response to the select signals S1* and S0 input at a high level at the gates of MOSFETs M30F' and M30C' and select signals S1 and S0* input at a low level at the gates of MOSFETs M40F' and M40C', respectively. Finally, switches 80' and 100' select the differential amplifier 40 in response to the select signals S1* and S0* input at a high level at the gates of MOSFETs M30F' and M30D' and select signals S1 and S0 input at a low level at the gates of MOSFETs M40F' and M40D', respectively. The same-channel MOSFETs cancel the effects of capacitive coupling of the select signals S0, S0*, S1 and S1*, to the input signals INPUTS 1–4 and the feedback signal, thereby cancelling switch feedthrough.

Figure 10:
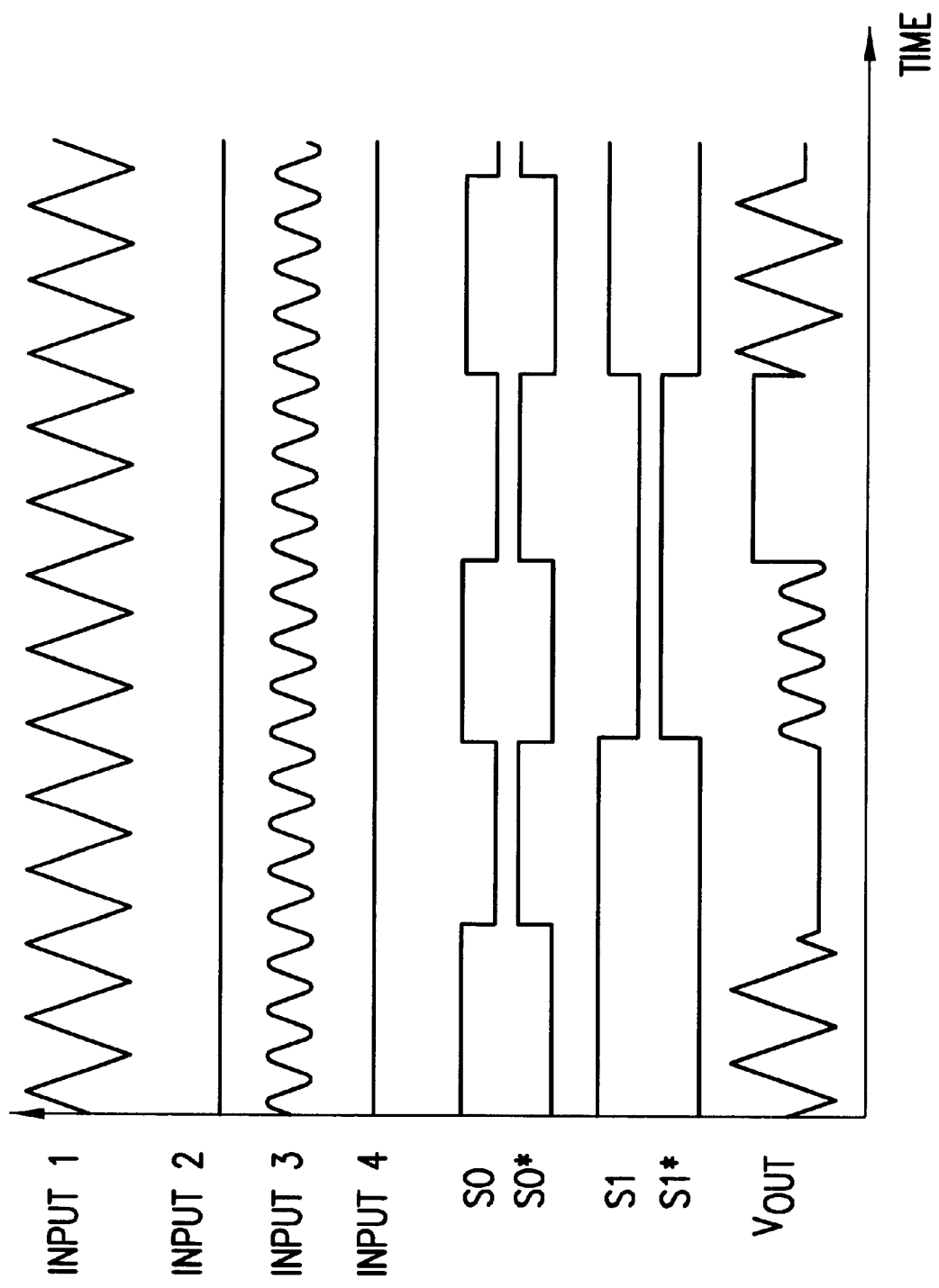
FIG. 10 depicts a timing diagram demonstrating the operation of the exemplary 4-to-1 multiplexing operational amplifiers depicted in FIGS. 8, 9a and 9b.

FIG. 10 depicts a timing diagram demonstrating the operation of the exemplary 4-to-1 multiplexing operational amplifier depicted in FIGS. 8 and 9. Referring to FIG. 10, when the select signals S0 and S1 are high and the select signals S0* and S1* are low, $V_{OUT}$ corresponds to INPUT 1 to the differential amplifier 10. When the select signals S0* and S1 are high and the select signals S0 and S1* are low, $V_{OUT}$ corresponds to INPUT 2 to the differential amplifier 20. When the select signals S0 and S1* are high and the select signals S0* and S1 are low, $V_{OUT}$ corresponds to INPUT 3 to the differential amplifier 30. Finally, when the select signals S0* and S1* are high and the select signals S0 and S1 are low, $V_{OUT}$ corresponds to INPUT 4 to the differential amplifier 40. This operation is also shown in Table III below.

TABLE III

| S0 | S0* | S1 | S1* | $V_{OUT}$ |
|---|---|---|---|---|
| 1 | 0 | 1 | 0 | INPUT 1 |
| 0 | 1 | 1 | 0 | INPUT 2 |
| 1 | 0 | 0 | 1 | INPUT 3 |
| 0 | 1 | 0 | 1 | INPUT 4 |

Figure 11:
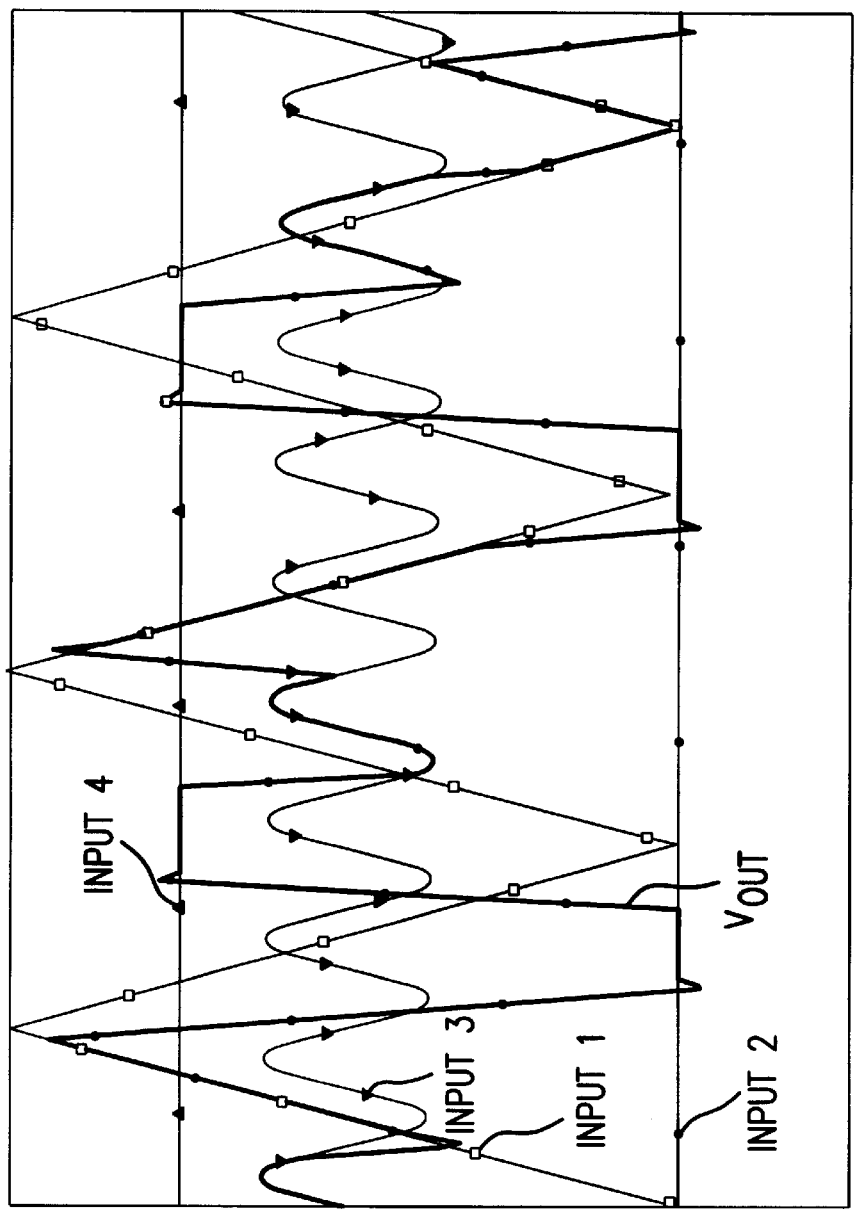
FIG. 11 illustrates exemplary transient response simulations of the exemplary 4-to-1 multiplying op-amps.

FIG. 11 illustrates exemplary transient response simulations of the 4-to-1 multiplexing op-amp shown in FIGS. 8, 9a and 9b. Referring to FIG. 11, INPUT 1 is represented by a triangle line marked with squares, INPUT 2 is represented by a straight line marked with diamonds, INPUT 3 is represented by a sinusoidal line marked with inverted triangles, INPUT 4 is represented by a straight line marked with triangles, and $V_{OUT}$ is represented by a line marked with circles. From FIG. 11, it is apparent that the output voltage $V_{OUT}$ follows the input voltages INPUT 1, INPUT 2, INPUT 3, and INPUT 4 as they are respectively selected.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A multiplexer comprising:
   a first switch responsive to complementary control signals, said first switch having a conductive state and a nonconductive state;
   a first differential amplifier having a first noninverting node connected to receive a first input signal and a first inverting node connected to receive a feedback signal, said first differential amplifier operating in response to said first switch being in said conductive state to produce a first signal corresponding to said first input signal;
   a second switch responsive to said complementary control signals, said second switch having a conductive state and a nonconductive state;
   a second differential amplifier having a second noninverting node connected to receive a second input signal and a second inverting node connected to receive said feedback signal, said second differential amplifier operating in response to said second switch being in said conductive state to produce a second signal corresponding to said second input signal; ad
   an output stage for outputting the first signal from said first differential amplifier when said first switch is in said conductive state or the second signal from said second differential amplifier when said second switch is in said conductive state, said feedback signal being the output of said output stage, wherein the first and second switches, the first and second differential amplifiers, and the output stage are included in an operational amplifier.

2. The multiplexer of claim 1, wherein the differential amplifiers and the switches comprise MOSFETs.

3. The multiplexer of claim 2, wherein each of the switches comprises back-to-back complementary MOSFETs.

4. The multiplexer of claim 2, wherein each of the switches comprises same-channel MOSFETs connected in series.

5. A method of multiplexing, comprising the steps of:
   receiving a first input signal at a first noninverting node of a first differential amplifier and a feedback signal at a first inverting node of said first differential amplifier;
   receiving a second input signal at a second noninverting node of a second differential amplifier and said feedback signal at a second inverting node of said second differential amplifier;
   operating said first differential amplifier in response to a first switch being in a conductive state to produce a first signal corresponding to said first input signal, said first switch being responsive to complementary control signals;
   operating said second differential amplifier in response to a second switch being in a conductive state to produce a second signal corresponding to said second input signal, said second switch being responsive to said complementary control signals; and
   outputting, via an output stage, the first signal from said first differential amplifier when said first switch is in said conductive state or said second signal from said second differential amplifier when said second switch is in said conductive state, said feedback signal being the output of said output stage, wherein the steps of receiving said first and second input signals, operating the first and second first differential amplifiers, and outputting are performed in an operational amplifier.

6. The method of claim 5, wherein the differential amplifiers and the switches comprise MOSFETs.

7. The method of claim 6, wherein each of the switches comprises back-to-back complementary MOSFETs.

8. The method of claim 6, wherein each of the switches comprises same-channel MOSFETs connected in series.

9. A multiplexing circuit for selecting an output which corresponds to one of a plurality of input signals, the multiplexing circuit comprising:
   a first input terminal in electrical communication with a first input node;
   a second input terminal in electrical communication with a second input node;
   an output terminal in electrical communication with a feedback node;
   a first transistor with a first transistor gate connected to said first input node, said first transistor having a first transistor source;

a second transistor with a second transistor gate connected to said feedback node, a second transistor source being tied to said first transistor source, said first transistor and said second transistor being disposed to form a first differential pair;

a current source;

a first select switch disposed to place said current source into electrical communication with said second transistor source which is tied to said first transistor source, said first select switch having two respective control terminals configured to respectively receive complementary control signals to place said first select switch into either a conductive state or a nonconductive state, wherein said first select switch in a conductive state places said first differential pair into electrical communication with said current source;

a third transistor with a third transistor gate connected to said second input node, said third transistor having a third transistor source;

a fourth transistor with a fourth transistor gate connected to said feedback node, a fourth transistor source being tied to said third transistor source, wherein said third transistor and said fourth transistor are disposed to form a second differential pair; and a second select switch disposed to place said current source into electrical communication with said fourth transistor source which is tied to said third transistor source, said second select switch having two respective second select switch control terminals configured to respectively receive said complementary control signals to place said second select switch into either a nonconductive state or a conductive state, wherein said second select switch in a conductive state places said second differential pair into electrical communication with said current source;

wherein said output of said multiplexing circuit corresponds to a first input signal applied to said first input terminal for said complementary control signals being in one state or to a second input signal applied to said second input terminal for said complementary control signals being in another state.

10. The multiplexing circuit of claim 9, wherein drain terminals of both said first and third transistors are tied together and wherein drain terminals of both said second and fourth transistors are tied together.

11. The multiplexing circuit of claim 9, wherein said first select switch is in a conductive state when said second select switch is in a nonconductive state, and wherein said second select switch is in a conductive state when said first select switch is in a nonconductive state.

12. The multiplexing circuit of claim 9, further comprising:

a current mirror comprising a first current mirror terminal and a second current mirror terminal, said first current mirror terminal being connected to said drain terminals of both said first and third transistors, said second current mirror terminal being connected to said drain terminals of both said second and fourth transistors.

13. The multiplexing circuit of claim 12, further comprising:

an output stage in electrical communication with said current mirror, with said second transistor gate, and with said fourth transistor gate, said output stage producing the output of said multiplexing circuit which is fed back to said second transistor gate and said fourth transistor gate.

14. The multiplexing circuit of claim 9, wherein at least one of said first and second select switches comprises complementary MOSFETs configured back-to-back.

15. The multiplexing circuit of claim 9, wherein at least one of said first and second select switches comprises same channel MOSFETs configured in series.

* * * * *

UNITED STATES PATENT AND TRADEMARK OFFICE
CERTIFICATE OF CORRECTION

PATENT NO. : 6,218,887 B1
DATED : April 17, 2001
INVENTOR(S) : Kevin L. Brown

It is certified that error appears in the above-identified patent and that said Letters Patent is hereby corrected as shown below:

Column 10,
Line 4, change "ad" to -- and --.

Signed and Sealed this

Twenty-eighth Day of August, 2001

Attest:

*Nicholas P. Godici*

NICHOLAS P. GODICI
*Acting Director of the United States Patent and Trademark Office*

*Attesting Officer*